United States Patent
Yoon et al.

(10) Patent No.: US 8,345,495 B2
(45) Date of Patent: Jan. 1, 2013

(54) TEST CIRCUIT, NONVOLATILE SEMICONDUCTOR MEMORY APPRATUS USING THE SAME, AND TEST METHOD

(75) Inventors: Jung Hyuk Yoon, Ichon-si (KR); Yoon Jae Shin, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 224 days.

(21) Appl. No.: 12/845,659

(22) Filed: Jul. 28, 2010

(65) Prior Publication Data

US 2011/0128805 A1    Jun. 2, 2011

(30) Foreign Application Priority Data

Nov. 27, 2009    (KR) .................. 10-2009-0115741

(51) Int. Cl.
*G11C 29/00*    (2006.01)
(52) U.S. Cl. ........................ 365/201; 365/200
(58) Field of Classification Search .................. 365/201, 365/200, 207
See application file for complete search history.

(56) References Cited

U.S. PATENT DOCUMENTS

| | | | |
|---|---|---|---|
| 5,553,025 A | 9/1996 | Haraguchi | |
| 5,646,898 A * | 7/1997 | Manning | 365/205 |
| 6,518,828 B2 * | 2/2003 | Seo et al. | 327/534 |
| 6,842,033 B1 | 1/2005 | Kim et al. | |

FOREIGN PATENT DOCUMENTS

| | | |
|---|---|---|
| JP | 01-173499 | 7/1989 |
| JP | 2004-045090 | 2/2004 |
| JP | 2009-211792 | 9/2009 |
| KR | 1020040023479 | 3/2004 |
| KR | 10-0492436 | 5/2005 |

* cited by examiner

*Primary Examiner* — Vu Le
(74) *Attorney, Agent, or Firm* — William Park & Associates Ltd.

(57) ABSTRACT

A test circuit of a nonvolatile semiconductor memory apparatus includes a first switching unit, a second switching unit, and a third switching unit. The first switching unit is configured to selectively interrupt application of a pumping voltage for a sense amplifier to a sense amplifier input node. The second switching unit is configured to selectively decouple the sense amplifier input node and a sub input/output node. The sub input/output node is coupled with a data storage region. The third switching unit is configured to selectively connect a voltage applying pad and the sense amplifier input node.

15 Claims, 2 Drawing Sheets

TEST CIRCUIT, NONVOLATILE SEMICONDUCTOR MEMORY APPRATUS USING THE SAME, AND TEST METHOD

CROSS-REFERENCES TO RELATED APPLICATION

The present application claims priority under 35 U.S.C. §119(a) to Korean application number 10-2009-0115741, filed on Nov. 27, 2009, in the Korean Intellectual Property Office, which is incorporated herein by reference in its entirety.

BACKGROUND

1. Technical Field

The present invention relates to a semiconductor integrated circuit, and more particularly, to a circuit and a method for testing a nonvolatile semiconductor memory apparatus.

2. Related Art

Among nonvolatile semiconductor memory apparatuses, a PCRAM (phase change random access memory) belongs to a next generation memory apparatus which has advantages of both a flash memory and a random access memory, that is, the non-volatility of the flash memory and the high speed of the random access memory. In the PCRAM, data is stored using the properties of a chalcogenide material which is changed between an amorphous phase and a crystalline phase by application of heat.

Referring to FIG. 1, a conventional nonvolatile semiconductor memory apparatus includes a sense amplifier 10, a data storage region 20, first, second, and third transistors P1, N1, and P2, respectively, and a pass gate PG1.

The sense amplifier 10 senses the voltage level of a sense amplifier input node node_SAI.

The first transistor P1 provides a pumping voltage VPPSA for sense amplifier to the sense amplifier input node node_SAI in a read operation.

The second transistor N1 couples a sub input/output node node_SIO with the sense amplifier input node node_SAI in the read operation.

The third transistor P2 couples the sub input/output node node_SIO and a sub input/output voltage pad VSIO in a test mode, such that a voltage can be forced from test equipment to the sub input/output node node_SIO.

The data storage region 20 stores the resistance value of a specified material which is changed between an amorphous phase and a crystalline phase by heat, as a data value.

The pass gate PG1 couples the data storage region 20 and the sub input/output node node_SIO in the read operation.

The nonvolatile semiconductor memory apparatus configured as mentioned above operates as described below in the read operation.

As the pass gate PG1 and the second transistor N1 are turned on, the sense amplifier input node node_SAI and the data storage region 20 are coupled with each other, and the pumping voltage VPPSA for sense amplifier is applied to the sense amplifier input node node_SAI.

The sense amplifier 10 senses and amplifies the voltage level of the sense amplifier input node node_SAI.

The nonvolatile semiconductor memory apparatus outputs the voltage level sensed and amplified by the sense amplifier 10, as a data value.

In a test, as the first transistor P1 is turned on, the pumping voltage VPPSA for sense amplifier is applied to the sense amplifier input node node_SAI, and as the second transistor N1 is turned on, the sense amplifier input node node_SAI and the sub input/output node node_SIO are coupled with each other. Also, as the pass gate PG1 is turned off, the data storage region 20 and the sub input/output node node_SIO are decoupled from each other. Further, as the third transistor P2 is turned on, the sub input/output node node_SIO and the sub input/output voltage pad VSIO are coupled with each other, and a voltage is forced to the sub input/output node node_SIO from the test equipment.

While changing the voltage level applied to the sub input/output voltage pad VSIO from the test equipment, whether the sense amplifier 10 can normally sense and amplify the voltage level of the sense amplifier input node node_SAI is tested.

In such a test, only whether the sense amplifier 10 operates normally with the voltage level applied from an outside changed is tested, and a voltage level that can be normally sensed and amplified by the sense amplifier 10 cannot be tested.

SUMMARY

A circuit and a method for testing a nonvolatile semiconductor memory apparatus which can test a voltage level that can be normally sensed and amplified by a sense amplifier constituting a nonvolatile semiconductor memory apparatus are described herein.

In one embodiment of the present disclosure, a test circuit of a nonvolatile semiconductor memory apparatus includes: a first switching unit configured to interrupt application of a pumping voltage for a sense amplifier to a sense amplifier input node in a test; a second switching unit configured to decouple the sense amplifier input node and a sub input/output node which is coupled with a data storage region, in the test; and a third switching unit configured to connect a voltage applying pad and the sense amplifier input node in the test.

In another embodiment of the present disclosure, a nonvolatile semiconductor memory apparatus including a sense amplifier for sensing and amplifying a voltage level of a sense amplifier input node includes: a test circuit configured to float the sense amplifier input node and apply a test voltage to the sense amplifier input node through a voltage applying pad in a test.

In another embodiment of the present disclosure, a method for testing a nonvolatile semiconductor memory apparatus including a sense amplifier for sensing and amplifying a voltage level of a sense amplifier input node includes the steps of: floating the sense amplifier input node in a test; applying a test voltage to the sense amplifier input node through a voltage applying pad; and activating the sense amplifier.

BRIEF DESCRIPTION OF THE DRAWINGS

Features, aspects, and embodiments are described in conjunction with the attached drawings, in which.

DETAILED DESCRIPTION

As used herein, the term "unit" can include an electronic circuit, one or more processors (e.g., shared, dedicated, or group of processors such as but not limited to microprocessors, digital signal processors, or central processing units) and memory that execute one or more software or firmware programs, combinational logic circuits, an application specific integrated circuit, and/or other suitable components that provide the described functionality. Additionally, the term "signal" may refer to one or more currents, one or more voltages, or a data signal.

Hereinafter, a nonvolatile semiconductor memory apparatus and a circuit and a method for testing the same according to the present disclosure will be described below with reference to the accompanying drawings through example embodiments.

Figure 1:
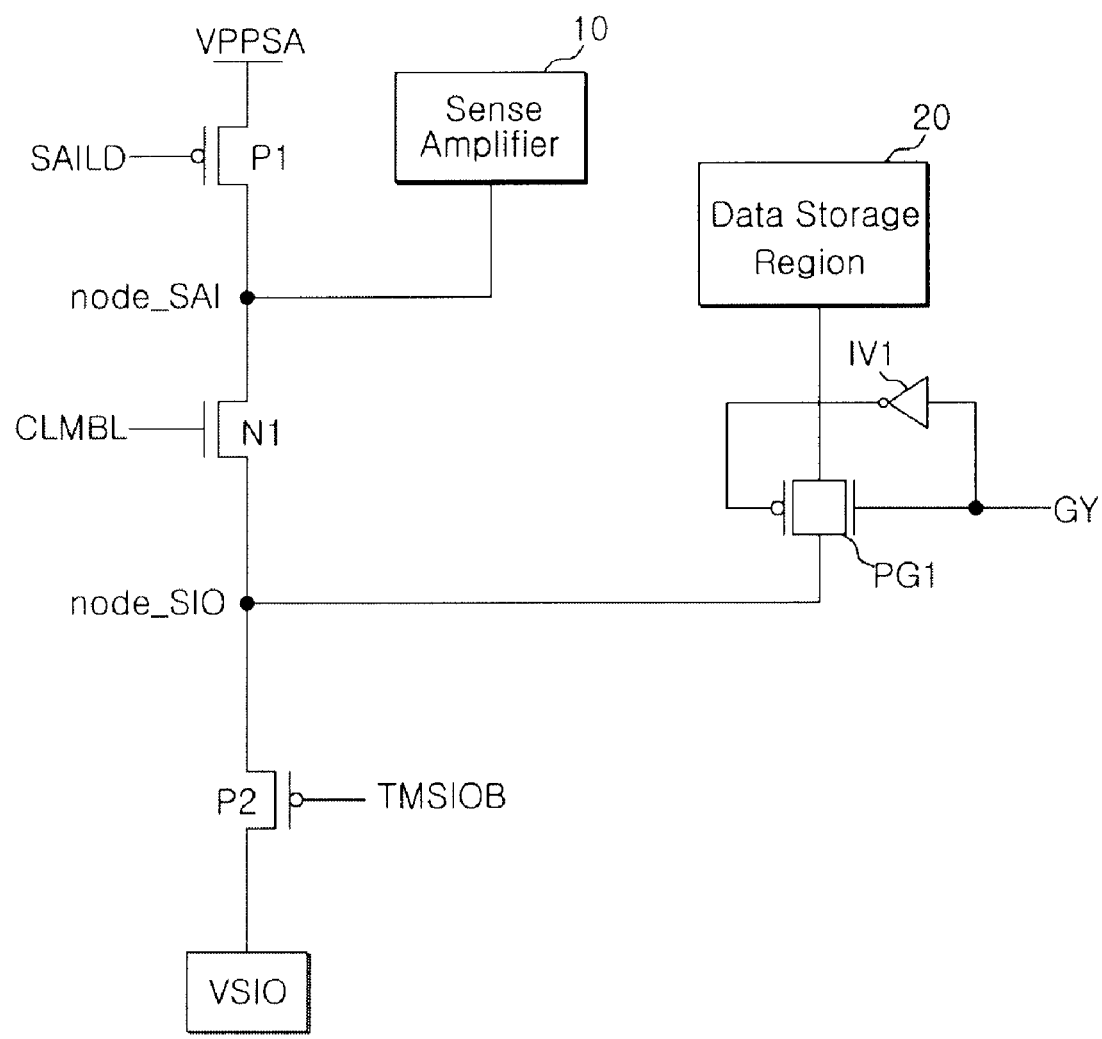
FIG. 1 is an example diagram of a conventional nonvolatile semiconductor memory apparatus.
Figure 2:
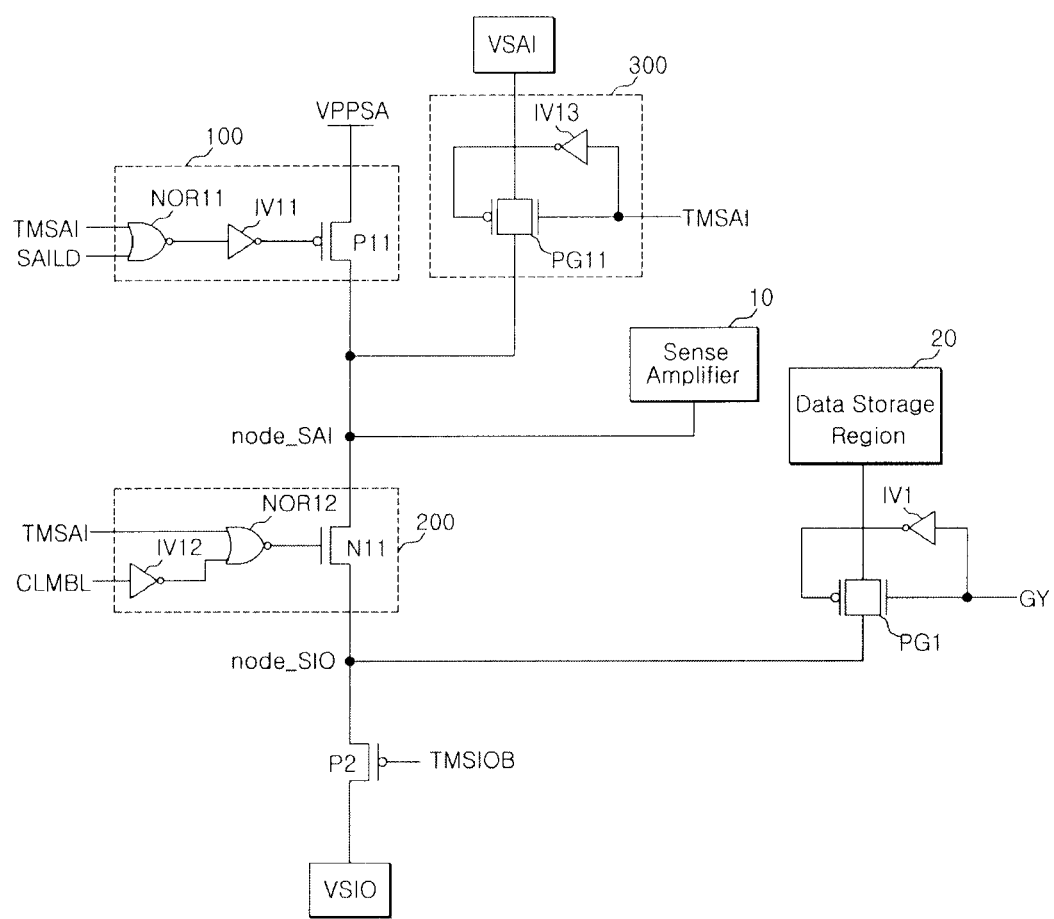
FIG. 2 is an example diagram of a nonvolatile semiconductor memory apparatus in accordance with an embodiment of the present disclosure.

Referring to FIG. 2, a nonvolatile semiconductor memory apparatus in accordance with an embodiment of the present disclosure includes a sense amplifier 10, a data storage region 20, a first pass gate PG1, a first inverter IV1, a first transistor P2, and first, second, and third switching units 100, 200, and 300, respectively.

The sense amplifier 10 senses and amplifies a voltage level of a sense amplifier input node node_SAI.

The data storage region 20 stores the resistance value of a specified material which is changed between an amorphous phase and a crystalline phase by heat, as a data value. In one example, the specified material can comprise a chalcogenide material and/or other suitable material.

The first pass gate PG1 couples or decouples the data storage region 20 and a sub input/output node node_SIO with or from each other in response to a first control signal GY.

The first inverter IV1 receives the first control signal GY. The first pass gate PG1 has a first control terminal which receives the first control signal GY and a second control terminal which receives the output signal of the first inverter IV1. The input terminal and the output terminal of the first pass gate PG1 are coupled between the data storage region 20 and the sub input/output node node_SIO. The first control signal GY is a signal which is enabled, for example, in a read operation, that is, when the data stored in the data storage region 20 is outputted.

In a first test mode, the first transistor P2 applies a first test voltage, from external test equipment (not shown), through a sub input/output voltage pad VSIO to the sub input/output node node_SIO.

The first transistor P2 has a gate that receives a first test signal TMSIOB, and a drain and a source which are coupled between the sub input/output node node_SIO and the sub input/output voltage pad VSIO.

The first switching unit 100 is configured to interrupt the application of a pumping voltage VPPSA for the sense amplifier 10 to the sense amplifier input node node_SAI in a second test mode. The first switching unit 100 selectively permits or interrupts the application of the pumping voltage VPPSA for the sense amplifier 10 to the sense amplifier input node node_SAI in response to a second control signal SAILD. For example, in one embodiment, the first switching unit 100, can apply the pumping voltage VPPSA for the sense amplifier 10 to the sense amplifier input node node_SAI when the second control signal SAILD is enabled (or disabled in some embodiments). The first switching unit 100 interrupts the application of the pumping voltage VPPSA for the sense amplifier 10 to the sense amplifier input node node_SAI when the second control signal SAILD is disabled (or enabled in some embodiments). In one embodiment, the second control signal SAILD can be a signal that is enabled, for example, when the data is output from the data storage region 20.

The first switching unit 100 includes a first NOR gate NOR11, a second inverter IV11, and a second transistor P11. The first NOR gate NOR11 receives a second test signal TMSAI and the second control signal SAILD. The second inverter IV11 receives an output signal of the first NOR gate NOR11. The second transistor P11 has a gate that receives the output signal of the second inverter IV11, a source operatively coupled to the pumping voltage VPPSA, and a drain operatively coupled to the sense amplifier input node node_SAI.

The second switching unit 200 is configured to decouple the sense amplifier input node node_SAI and the sub input/output node node_SIO from each other in the second test mode. More specifically, the second switching unit 200 selectively couples or decouples the sense amplifier input node node_SAI and the sub input/output node node_SIO with or from each other in response to a third control signal CLMBL. For example, in one embodiment, the second switching unit 200 couples the sense amplifier input node node_SAI and the sub input/output node node_SIO with each other when the third control signal CLMBL is enabled (or disabled in some embodiments). The second switching unit 200 decouples the sense amplifier input node node_SAI and the sub input/output node node_SIO from each other when the third control signal CLMBL is disabled (or enabled in some embodiments). The third control signal CLMBL is a signal that is enabled, for example, when data is output from the data storage region 20.

The second switching unit 200 includes a second NOR gate NOR12, a third inverter IV12, and a third transistor N11. The third inverter IV12 receives the third control signal CLMBL. The second NOR gate NOR12 receives the second test signal TMSAI and an output signal of the third inverter IV12. The third transistor N11 has a gate that receives the output signal of the second NOR gate NOR12, and a drain and a source operatively coupled between the sense amplifier input node node_SAI and the sub input/output node node_SIO as shown.

The third switching unit 300 is configured to couple a sense amplifier voltage applying pad VSAI and the sense amplifier input node node_SAI in the second test mode. For example, the third switching unit 300 couples the sense amplifier voltage applying pad VSAI and the sense amplifier input node node_SAI when the second test signal TMSAI is enabled (or disabled in some embodiments), and decouples the sense amplifier voltage applying pad VSAI and the sense amplifier input node node_SAI when the second test signal TMSAI is disabled (or enabled in some embodiments). The sense amplifier voltage applying pad VSAI is a pad that receives the second test voltage from the external test equipment (not shown) and applies the received second test voltage to the sense amplifier input node node_SAI through the third switching unit 300.

The test circuit of a nonvolatile semiconductor memory apparatus configured as mentioned above operates as described below.

As the second test signal TMSAI is enabled, the sense amplifier input node node_SAI floats. In other words, the first switching unit 100 interrupts the application of the pumping voltage VPPSA for the sense amplifier 10 to the sense amplifier input node node_SAI. The second switching unit 200 decouples the sense amplifier input node node_SAI and the sub input/output node node_SIO. Thus, even when the first control signal GY is enabled, the data storage region 20 and the sense amplifier input node node_SAI are decoupled from each other.

When the second test signal TMSAI is enabled, the third switching unit 300 couples the sense amplifier voltage applying pad VSAI (which can be operatively coupled with the external test equipment), with the sense amplifier input node node_SAI. As the sense amplifier voltage applying pad VSAI and the sense amplifier input node node_SAI are coupled with each other, the second test voltage is applied to the sense amplifier input node node_SAI from the external test equipment.

As the second test voltage is applied to the sense amplifier input node node_SAI, the sense amplifier 10 is activated and senses and amplifies the voltage level of the sense amplifier input node node_SAI. The voltage level of the sense amplifier input node node_SAI that is sensed and amplified by the sense amplifier 10 is output as a data value.

The operations of applying a new second test voltage with a voltage level different from that of the current second test voltage to the sense amplifier input node node_SAI, activating the sense amplifier 10, sensing and amplifying the voltage level of the sense amplifier input node node_SAI, and outputting the sensed and amplified voltage level as the data value are repeated until the data value becomes the same as a preset data value.

As is apparent from the above description, in the test circuit of a nonvolatile semiconductor memory apparatus in accordance with an embodiment of the present disclosure, the voltage level of a sense amplifier input node that can be sensed and amplified by a sense amplifier can be tested, whereby the reliability of a nonvolatile semiconductor memory apparatus can be improved.

While certain embodiments have been described above, it will be understood to those skilled in the art that the embodiments described are by way of example only. Accordingly, the nonvolatile semiconductor memory apparatus and the circuit and the method for testing the same described herein should not be limited based on the described embodiments. Rather, the nonvolatile semiconductor memory apparatus and the circuit and the method for testing the same described herein should only be limited in light of the claims that follow when taken in conjunction with the above description and accompanying drawings.

What is claimed is:

1. A test circuit of a nonvolatile semiconductor memory apparatus comprising:
   a first switching unit configured to selectively interrupt application of a pumping voltage to a sense amplifier input node in response to a test signal;
   a second switching unit configured to selectively decouple the sense amplifier input node and a sub input/output node in response to the test signal, wherein the sub input/output node is operatively coupled with a data storage region; and
   a third switching unit configured to connect a voltage applying pad and the sense amplifier input node in response to the test signal.

2. The test circuit according to claim 1 further comprising a sense amplifier circuit operatively coupled to the sense amplifier input node, wherein the sense amplifier senses and amplifies a voltage level of the sense amplifier input node.

3. The test circuit according to claim 1, wherein the first switching unit is operative to one of permit and interrupt the application of the pumping voltage for a sense amplifier to the sense amplifier input node in response to a first control signal and the test signal.

4. The test circuit according to claim 1, wherein the second switching unit is operative to one of couple and decouple the sense amplifier input node and the sub input/output node in response to a second control signal and the test signal.

5. The test circuit according to claim 1, wherein the third switching unit is operative to apply a test voltage to the sense amplifier input node through the voltage applying pad from external test equipment in response to the test signal.

6. A nonvolatile semiconductor memory apparatus including a sense amplifier for sensing and amplifying a voltage level of a sense amplifier input node, comprising:
   a test circuit configured to float the sense amplifier input node and apply a test voltage to the sense amplifier input node through a voltage applying pad during a test.

7. The nonvolatile semiconductor memory apparatus according to claim 6, wherein the test circuit is operative to interrupt application of a pumping voltage for the sense amplifier to the sense amplifier input node and to decouple the sense amplifier input node and a data storage region from each other.

8. The nonvolatile semiconductor memory apparatus according to claim 7, wherein the test circuit is operative to selectively permit and interrupt the application of the pumping voltage for the sense amplifier to the sense amplifier input node in response to a first control signal, and to selectively couple and decouple the sense amplifier input node and the data storage region in response to a second control signal.

9. The nonvolatile semiconductor memory apparatus according to claim 8, wherein the test circuit comprises:
   a first switching unit configured to interrupt the application of the pumping voltage for the sense amplifier to the sense amplifier input node regardless of the first control signal when a test signal is enabled, and to selectively permit and interrupt the application of the pumping voltage for the sense amplifier to the sense amplifier input node in response to the first control signal when the test signal is disabled; and
   a second switching unit configured to decouple the sense amplifier input node and the data storage region from each other regardless of the second control signal when the test signal is enabled, and to selectively couple and decouple the sense amplifier input node and the data storage region in response to the second control signal when the test signal is disabled.

10. The nonvolatile semiconductor memory apparatus according to claim 6, wherein the test circuit further comprises:
    a switching unit configured to apply the test voltage to the sense amplifier input node through the voltage applying pad from external test equipment when the test signal is enabled.

11. A method for testing a nonvolatile semiconductor memory apparatus including a sense amplifier for sensing and amplifying a voltage level of a sense amplifier input node, the method comprising:
    floating the sense amplifier input node;
    applying a test voltage to the sense amplifier input node through a voltage applying pad; and
    activating the sense amplifier.

12. The method according to claim 11, wherein floating the sense amplifier input node comprises:
    interrupting application of a pumping voltage to the sense amplifier input node; and
    decoupling the sense amplifier input node and a data storage region.

13. The method according to claim 11, wherein applying the test voltage to the sense amplifier input node through the voltage applying pad comprises:
    applying the test voltage from external test equipment to the voltage applying pad.

14. The method according to claim 11, wherein activating the sense amplifier comprises:
    sensing and amplifying the voltage level of the sense amplifier input node and providing the sensed and amplified voltage level as a data value, by using the sense amplifier.

15. The method according to claim 14, wherein operations of applying a test voltage with a voltage level different from that of the test voltage to the sense amplifier input node and activating the sense amplifier are repeated until a preset data value is provided in the operation of sensing and amplifying the voltage level of the sense amplifier input node and providing the sensed and amplified voltage level as the data value by using the sense amplifier.

* * * * *